(12) United States Patent
Cheng

(10) Patent No.: US 10,138,539 B1
(45) Date of Patent: Nov. 27, 2018

(54) METHOD OF MANAGING COATING UNIFORMITY WITH AN OPTICAL THICKNESS MONITORING SYSTEM

(71) Applicant: Shiping Cheng, San Jose, CA (US)

(72) Inventor: Shiping Cheng, San Jose, CA (US)

(*) Notice: Subject to any disclaimer, the term of this patent is extended or adjusted under 35 U.S.C. 154(b) by 0 days.

(21) Appl. No.: 15/944,446

(22) Filed: Apr. 3, 2018

(51) Int. Cl.
*C23C 14/54* (2006.01)
*C23C 14/04* (2006.01)
*C23C 14/24* (2006.01)

(52) U.S. Cl.
CPC ........... *C23C 14/044* (2013.01); *C23C 14/24* (2013.01); *C23C 14/547* (2013.01)

(58) Field of Classification Search
CPC ..... C23C 14/54; C23C 14/542; C23C 14/547; C23C 16/52
See application file for complete search history.

(56) References Cited

U.S. PATENT DOCUMENTS

| | | | | |
|---|---|---|---|---|
| 4,857,721 A * | 8/1989 | Dunavan | ............... | G01S 3/7835 250/206.1 |
| 5,923,429 A * | 7/1999 | Takeuchi | ........... | G01B 11/0683 356/504 |
| 5,936,730 A * | 8/1999 | Foley | ................ | B01J 19/0046 356/244 |
| 5,999,267 A * | 12/1999 | Zawaideh | .......... | G01B 11/0625 356/503 |
| 6,045,671 A * | 4/2000 | Wu | ......................... | C04B 35/01 118/504 |
| 7,566,853 B2 * | 7/2009 | Tuckerman | ....... | H01L 27/14618 250/208.1 |
| 7,767,627 B1 * | 8/2010 | Goldwasser | ......... | B01J 19/0046 427/265 |
| 9,454,004 B2 * | 9/2016 | Beresnev | ............... | H01S 3/1307 |
| 2002/0029956 A1 * | 3/2002 | Allen | ................. | B08B 7/0042 204/157.15 |
| 2003/0226972 A1 * | 12/2003 | Wong | .................... | G01T 1/2002 250/368 |

(Continued)

OTHER PUBLICATIONS

Villa, Francisco, et al., "Correction masks for thickness uniformity in large-area thin films". Applied Optics, vol. 39, No. 10, Apr. 1, 2000, pp. 1602-1610.*

(Continued)

*Primary Examiner* — Bret P Chen
(74) *Attorney, Agent, or Firm* — SciNova LLC; Jingfeng Song

(57) ABSTRACT

The subject matter of the invention is a method for managing the coating thickness on a substrate in a physical vapor deposition system. Said method is applied to the system that comprises a multi-beam laser monitoring system and a uniformity control system with a multi-mask set. Said method comprises steps of computing error function for transmission of laser passing through the coating layer, ceasing the deposition process based on the comparison between the error function and a predetermined constant, comparing deposition rates among all laser beams, identifying the area of the coating layer with a different deposition rate, adjusting the multi-mask set to modify the deposition rate on that coating area in the next deposition process, and resuming the deposition process for the next coating layer until uniformity of the coating thickness is reached.

8 Claims, 2 Drawing Sheets

(56) References Cited

U.S. PATENT DOCUMENTS

2004/0145053 A1* 7/2004 Auner .................... B23K 35/36
    257/737
2008/0299496 A1* 12/2008 Hirakata ............ B23K 26/0661
    430/319
2008/0299871 A1* 12/2008 Eisenstock .............. B24B 21/06
    451/23

OTHER PUBLICATIONS

Hus, Jin-Cherng, "Analysis of the thickness uniformity improved by using wire masks for coating optical bandpass filters". Applied Optics, vol. 53, No. 7, Mar. 1, 2014, pp. 1474-1480.*

Sassolas, B., et al., "Masking technique for coating thickness control on large and strongly curved aspherical optics". Applied Optics , 2009, 46, pp. 3760-3765.*

Su, Jinshan, et al., "Long range detection of line-array multi-pulsed coding lidar by combining the Accumulation coherence and Subpixel-energy detection method". Optics Express 15174, vol. 23, No. 12, Jun. 15, 2015, pp. 1-12.*

* cited by examiner

METHOD OF MANAGING COATING UNIFORMITY WITH AN OPTICAL THICKNESS MONITORING SYSTEM

BACKGROUND OF THE INVENTION

Physical vapor deposition (PVD) plays an important role in today's coating process of mass production. PVD is characterized by a process in which the coating material goes from a condensed phase (also called target source) to a vapor phase in an environment with a high vacuum and high temperature and then back to a thin film condensed on a substrate, the product or material that needs to be coated. Compared to the traditional coating methods such as the electroplating process, PVD coatings are more corrosion resistant and durable. In addition, it could be applied to a more diverse group of substrates and surfaces.

However, maintaining uniformity of the coating thickness has been a challenge during the PVD's deposition process. The method used by the industry for managing the coating thickness is to insert one or multiple shielding masks between the substrate and the evaporation source of the coating material. The placement of the shielding mask in the PVD coating chamber helps the evaporated coating material to distribute and deposit more evenly on the surface of the substrate. The effect of the shielding mask on the coating uniformity greatly relates to the shape of the shielding mask. In order to identify the shielding mask's shape that helps achieve the best result of uniformity, a pilot study must be conducted before proceeding to the mass production. In the case of a long time production process for high end products, the shape of the shielding mask needs to be periodically adjusted and calibrated. However, the shielding mask is usually made by hand before the test run. In order to find the best one that fits the process a large amount of shielding masks with different shapes must be prepared. The preparation and test of the conventional shielding mask is time-consuming. Making fine adjustment on the shape of the shielding mask is very inconvenient if not impossible. This could lead to missing the best shape for a good uniformity result. In addition, the reproducibility of test results is low due to the lack of consistency and repeatability of the manually prepared shielding mask.

Therefore, it is very much needed to have a shielding mask that is designed to be quickly set up in the coating process and whose shape can be easily adjusted or tuned without the remaking of the mask. In the meantime, having specially-designed masks is only halfway done in achieving coating uniformity. A method also needs to be developed so that the on-going status of the coating thickness on the substrate could be monitored in real time and provides feedbacks on how and when masks should be used for maintaining uniformity during the deposition process. In this way, appropriate masks would be chosen to either facilitate or reduce the deposition of coating materials on a certain surface area of the substrate and the deposition process could be adjusted accordingly for the next layer's coating.

SUMMARY OF THE INVENTION

It is the object of the current invention to develop a method of monitoring and maintaining uniformity of coating thickness on substrates during the deposition process. The method is successfully established and controlled by a uniformity management system that comprises a multi-channel optical monitoring system and a uniformity control system.

In some embodiments of the invention, the method comprises steps of making judgment on when the deposition of the first coating layer ends, comparing the deposition rates on different surface areas of the substrate, applying a multi-mask set for the purpose of maintaining the overall coating uniformity on the substrate, and resuming the deposition process for the next coating layer.

In some particular embodiments of the invention, the method comprises a step of making layer ending judgment by using the data of laser transmission passing through the coating layer during the deposition process. In other particular embodiments of the invention, the method comprises a step of adjusting the deposition rate on a certain surface area of the substrate by placing a suitable tunable mask on the multi-mask set between the target source and the substrate.

DETAILED DESCRIPTION OF THE PREFERRED EMBODIMENTS

A system called Uniformity Management System (UMS) has been developed to manage the application of shielding masks in the PVD coating process. The UMS comprises a multi-channel optical monitoring system and a uniformity control system. It is installed with a PVD coating system. During the coating process the UMS determines the ending of each coating layer, calculates the rough uniformity profile on the working range, and makes the selection of right tunable mask for the next coating layer.

Figure 1:
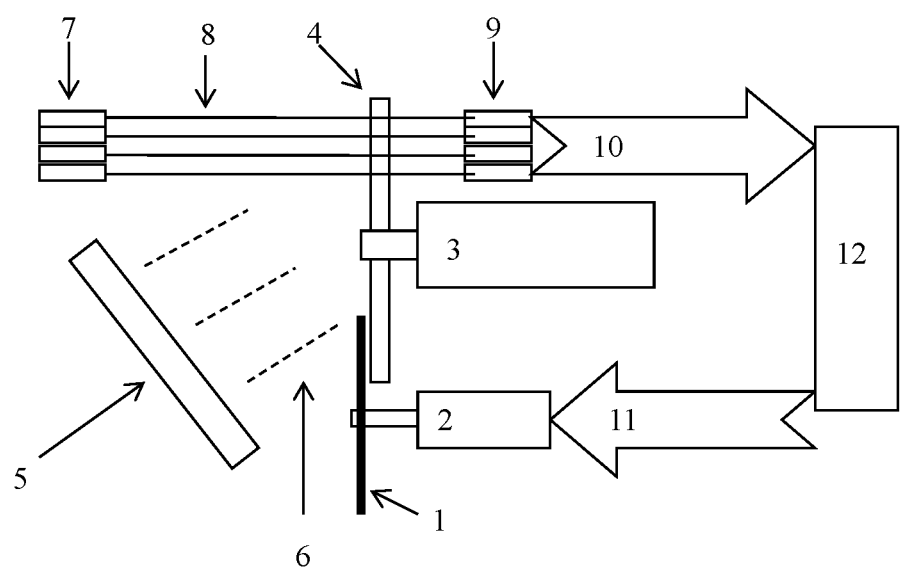
FIG. 1 schematically illustrates the UMS in a PVD coating system.

The schematic of a typical UMS is shown in FIG. 1. The PVD coating system has a substrate 4 and a target source 5, which is the solid phase of coating materials. The vapor phase 6 of the coating materials is formed and going to be deposited on the substrate 4 when the PVD system is activated. A high speed motor 3 is attached to the substrate 4 and helps it to spin at certain speed during the coating process for uniform deposition. The multi-channel optical monitoring system includes a laser array 7 and a detector array 9. Multiple laser light beams 8 come out from the laser array 7 and go through the coating layer on the substrate 4 before they are received and detected by the detector array 9. The optical signals are amplified, transformed by an analog-to-digital converter 10, and sent to a computer 12 for data processing. The uniformity control system has a multi-mask set 1, on which there are several tunable masks. As shown in FIG. 1, the multi-mask set 1 in a UMS is placed near the space between the substrate 4 and the target source 5 when it is in use. The multi-mask set 1 is attached to a motor 2, which is used to adjust the position and orientation of the tunable masks on the set based on the signal sent from the computer 12 and converted by a digital to analog converter 11. With the help of this control system in the UMS uniformity of overall coating thickness on the substrate can be maintained by adjusting and compensating the thickness of each coating layer or sublayer during the deposition process.

A low-pass filter is used to pass laser light signals that are received by the detector array 9 and have a frequency lower than a certain cutoff frequency. The filtered signals are then normalized to denote the light transmission passing through the coating layer. The least squares method is applied in the curve fitting process of the transmission data. The light transmission $T_{(i)}$ and the derivative of the light transmission $dT_{(i)}$ for each laser channel are obtained. A weighting factor $w_{(i)}$ is used for each laser channel. Equivalent value, i.e. the sum of the light transmission values or their derivatives, of $T_{(i)}$ or $dT_{(i)}$ from all laser channels are as follows:

$$T_{eq} = B/A \text{ and } dT_{eq} = C/A$$

Wherein $T_{eq}$ is the Equivalent value of $T_{(i)}$, i=1, 2, 3, ... m
Wherein $dT_{eq}$ is the Equivalent value of $dT_{(i)}$, i=1, 2, 3, ... m $$A = w_{(1)} + w_{(2)} + \ldots + w_{(i)} + \ldots + w_{(m)}$$

$$B = T_{(1)} * w_{(1)} + T_{(2)} * w_{(2)} + \ldots + T_{(i)} * w_{(i)} + \ldots + T_{(m)} * w_{(m)}$$

$$C = dT_{(1)} * w_{(1)} + dT_{(2)} * w_{(2)} + \ldots + dT_{(i)} * w_{(i)} + \ldots + dT_{(m)} * w_{(m)}$$

A global turning point has the maximum value of the light transmission. Deposition of a particular coating layer terminates at the global turning point. For a definite stack of thin coating layers with a typical monitoring curve of light transmission, there is a series of fixed global turning points $T_{pv(i)}$, i=1, 2, ... Ni for each of all coating layers. N is the total number of the turning points. For the $k_{th}$ coating layer the real ending transmission $T_{e(k)}$ lies after two turning points at j-1 and j. The value of $T_{e(k)}$ can be calculated from the real transmission values of $T_{pv(j-1)}$ and $T_{pv(j)}$ at these two turning points.

$$T_{e(k)} = T_{pv(j)} [T_{pv(j)} - T_{pv(j-1)}] * A$$

The factor A is calculated from the theoretical transmission $T_{eo(k)}$, $T_{pvo(j-1)}$ and $T_{pvo(j)}$.

$$A = [T_{eo(k)} - T_{pvo(j)}] / [(T_{pvo(j)} - T_{pvo(j-1)}]$$

$T_{eo(k)}$, $T_{pvo(j-1)}$ and $T_{pvo(j)}$ can be calculated from optical thin film design software, such as TFCal. The derivative of the real ending transmission $dT_{e(k)}$ can be obtained from the following formula, $$dT_{e(k)} = dT_{eo(k)} * [T_{pv(j)} - T_{pv(j-1)}] / [(T_{pvo(j)} - T_{pvo(j-1)}]$$

The theoretical derivative of the theoretical transmission $dT_{eo(k)}$ can be obtained from the following formula, $$dT_{eo(k)} = 3.1415926535 * (1/n^2 - 1)[(y^2 + x^2 - n^2)\sin(p) - 2ny\cos(p)]/(8x)$$

$$p = 3.1415926535 * Q_{wt(k)}$$

Wherein n is the refractive index of the layer, x and y are the real and imaginary part of initial admittance before the deposition of the $k_{th}$ coating layer starts, and $Q_{wt(k)}$ is the optical thickness of the $k_{th}$ layer.

Once the transmission and derivative data discussed above are collected, the UMS combines them together to form an ending judgment for a layer coating on the substrate. The ending judgment is defined by error function ERR as follows:

$$ERR = \{P1[T_{eq} - T_{e(k)}]^2 + P2[dT_{eq} - dT_{e(k)}]^2\}/(P1 + P2)$$

Wherein P1 and P2 are weighting factors, which are pre-set according to layer ending state or stop conditions. When the ERR value is less or equal to e, which is a predetermined constant value, the deposition should be stopped for the coating on that layer. When the point for the layer ending or deposition stopping is reached, no vapor is generated from the target source. However, if the ERR value remains larger than e, the coating on that layer continues. The value of e depends on other elements in the coating process, such as the types of coating materials and the thickness of a coating layer.

The error function can also be applied to each laser channel.

$$ERR_{(i)} = \{P1[T_{(i)} - T_{e(k)}]^2 + P2[dT_{(i)} - dT_{e(k)}]^2\}/(w1 + w2)$$

During the deposition of a coating layer, $ERR_{(i)}$ keeps decreasing when the ending point is approached for that layer. A deposition rate profile at each laser channel can be established when the value of $ERR_{(i)}$ is plotted against the time before the ending point is reached. Because the laser channels pass through different surface areas of the substrate, different deposit rates means that the coating thickness among these areas is likely to be different. Based on the difference among these deposition rates, the UMS would select one or more tunable masks and add them to the PVD system for the next layer coating and set up the uniformity compensation between these two adjacent coating layers.

Figure 2:
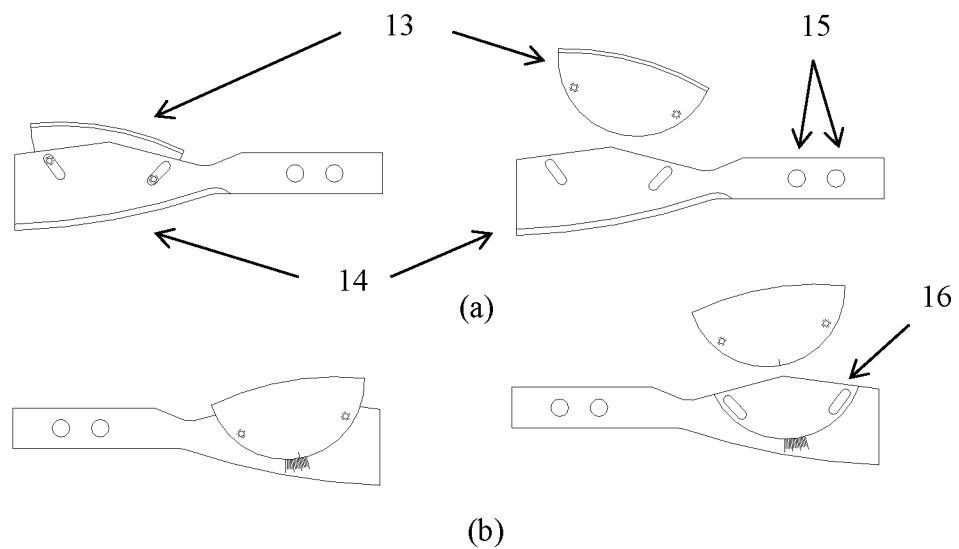
FIG. 2 shows a tunable mask with an upper piece, a lower piece, and an arc rail.

A preferred tunable mask is shown in FIG. 2. The mask is made of stainless steel and has two sides, the underside (a) and the topside (b). It comprises an upper piece 13, a lower piece 14, and a mask body 15 with two mounting holes that are used to attach the tunable mask to the UMS system. When both pieces 13 and 14 are put together, the upper piece 13 can be tuned and moved along a circular track 17 formed on the lower piece 14 before both pieces are fixed together by screws. The shape and size of the tunable pieces may be changed depending on the coating need. A preferred UMS system usually consists of several tunable masks for the coating of each layer. These tunable masks are installed on the multi-mask set. When any of these masks is in used, it is placed between the source target and the substrate. The mask blocks a certain path of the vapor, from which it can reach to and deposit on a certain surface area of the substrate. By changing the position and shape of the upper piece of a mask, it affects the deposition rate of a coating material at a certain surface area of the substrate.

When two different coating materials, such as material H (high refractive index) and material L (low refractive index), are applied to a substrate, at least two tunable masks, HP and HN, are used for material H and at least two other tunable masks, LP and LN, are used for material L. When three tunable masks are used for each material, there are masks HP, H, and HN for material H and masks LP, L, and LN for material L. The HP and LP masks provide positive uniformity distribution profiles, which help increase the deposition rate on a certain surface area of the substrate. The HN and LN masks provide negative uniformity distribution profiles, which help decrease the deposition rate on a certain surface area of the substrate. The H and L masks provide flat uniformity distribution profiles, which neither increase nor decrease the deposition rate on a certain surface area of the substrate. These masks help the deposition on the final coating.

To achieve a better result of uniformity, the UMS may further divide a layer into several sub-layers during the coating process. The ending judgment and thickness management are applied to each sub-layer. Once a method of coating uniformity is established for a substrate, the tunable masks used for each sub-layer on this substrate should remain unchanged so that the solution for the layer separation helps maintain a workable uniformity compensation state during the whole deposition process.

Example 1

Two film coating materials, a high refractive index material and a low refractive index material, need to be applied to a substrate. The multi-channel optical monitoring system consists of two laser channels. The light spot (R1) of channel 1 is at radius R1 of the substrate and the light spot (R2) of channel 2 is at radius R2. R1 is larger than R2. The light transmission of channel 1 and channel 2 are $T_{(1)}$ and $T_{(2)}$, respectively. Because the substrate is rotated during the deposition process, the light spot R1 or R2 represents a ring-shaped area on the substrate.

There are four tunable masks on the multi-mask set. Masks HP and HN are used to modify the uniformity of the layer with the high refractive index material (high index layer). The mask HP is used for positive uniformity distribution, which helps the deposition rate at R1 to be larger than the one at R2. The mask HN is used for negative uniformity distribution which helps the deposition rate at R1 to be smaller than the one at R2. The other two masks LP and LN are used to modify the uniformity of the layer with the low refractive index material (low index layer). Similar to masks HP and HN, the mask LP is used for positive uniformity distribution and the mask LN is used for negative uniformity distribution.

In this two channel monitoring system, when both channels have equal weighting factors in data processing, i.e., $w_{(1)}=w_{(2)}$, the equivalent value for $T_{(1)}$ and $T_{(2)}$ is calculated as follows, $$T_{eq}=(T_{(1)}+T_{(2)})/2$$

The equivalent value of $dT_{(1)}$ and $dT_{(2)}$ is calculated as follows, $$dT_{eq}=(dT_{(1)}+dT_{(2)})/2$$

The weighting factors P1 and P2 in the error function formula are pre-determined based on different layer stopping conditions, $$ERR=\{P1[T_{eq}-T_{e(k)}]^2+P2[dT_{eq}-dT_{e(k)}]^2\}/(P1+P2)$$

There are two basic cases that represent most of real layer cases. In Case 1, P1 is equal to 1 and P2 is equal to 0. In Case 2, P1 is equal to 0 and P2 is equal to 1. Therefore, the formula for error function calculation can be simplified as follows, $$ERR=[(T_{(1)}+T_{(2)})/2-T_{e(k)}]^2 \qquad \text{Case 1}$$

$$ERR=[(dT_{(1)}+dT_{(2)})/2-dT_{e(k)}]^2 \qquad \text{Case 2}$$

For each case, when the ERR value is smaller than e, the layer deposition in the PVD coating system is stopped.

In this two channel monitoring system, the value of error function for channel 1 can be simplified as follows, $$ERR_{(1)}=T_{(1)}-T_{e(k)} \qquad \text{Case 1}$$

$$ERR_{(1)}=dT_{(1)}-dT_{e(k)} \qquad \text{Case 2}$$

Similarly, the value of error function for channel 2 is simplified as follows, $$ERR_{(2)}=T_{(2)}-T_{e(k)} \qquad \text{Case 1}$$

$$ERR_{(2)}=dT_{(2)}-dT_{e(k)} \qquad \text{Case 2}$$

During layer deposition the relationship among the values of $ERR_{(1)}$, $ERR_{(2)}$, and ERR is as follows, $$ERR=(ERR_{(1)}+ERR_{(2)})/2$$

The ERR value is used by the UMS to make judgment for stopping the deposition process for a layer. Although $ERR_{(1)}$ or $ERR_{(2)}$ can also be used for layer stopping judgment, they are mainly used for maintaining uniformity distribution on the layers through the mask control.

When $ERR_{(1)}$ is smaller than $ERR_{(2)}$, it means the deposition rate at R1 is higher than the one at R2. To maintain thickness uniformity between R1 and R2 the mask HN or LN will be used for the coating of next layer depending whether the layer is made of a low or high refractive index material. When $ERR_{(1)}$ is larger than $ERR_{(2)}$, it means the deposition rate at R1 is slower than the one at R2. Under this condition, the UMS will use the mask HP or LP for the coating of next layer. During the deposition process for the coating of a multi-layer thin film, the UMS is able to automatically make judgment on deposition ending for each layer and adjust the coating uniformity through its multi-channel optical monitoring system and the uniformity control system, which consists of tunable masks.

What is claimed is:

1. A method of managing thickness uniformity for coating layer on a substrate in a coating system comprising:
    under the application of a uniformity control system comprising a multi-mask set and a multi-beam optical monitoring system having a laser array and a detector array,
    computing error function based on transmission of laser in all laser beams passing through the coating layer being formed on the substrate during a deposition process;
    comparing the value of said error function of all laser beams to a predetermined constant value;
    ceasing said deposition process when the value of said error function of all laser beams is less or equal to said constant value;
    computing error function of each laser beam in said optical monitoring system once said deposition process is stopped;
    computing deposition rates for each laser beam by plotting the value of error function of each laser beam against the time of said deposition process;
    selecting the laser beam with a deposition rate different from other laser beams and identifying a certain area of said coating layer through which the laser beam passes;
    adjusting said multi-mask set in a way that it is to affect the deposition process on said certain area of said coating layer so that a suitable deposition rate is to be applied to said certain area;
    resuming next deposition process to form next coating layer under the adjustment of said multi-mask set.

2. The method of claim 1 wherein the coating system is a physical vapor deposition system that comprises a target source and a substrate.

3. The method of claim 1 wherein the multi beam optical monitoring system has at least two laser beams.

4. The method of claim 1 wherein said coating layer consists of two sublayers and the material in the sublayer immediately attached to the substrate has a lower refractive index than the material in another sublayer.

5. The method of claim 1 wherein the next coating layer consists of two sublayers and the material in the sublayer immediately attached to the substrate has a higher refractive index than the material in another sublayer.

6. The method of claim 1 wherein the multi-mask set has four tunable masks.

7. The method of claim 6 wherein the tunable masks have changeable sizes and shapes.

8. The method of claim 6 wherein adjusting said multi-task set is to place one of four tunable masks between the target source and the substrate.

\* \* \* \* \*